(12) United States Patent
Yoshimochi

(10) Patent No.: US 7,259,424 B2
(45) Date of Patent: Aug. 21, 2007

(54) SEMICONDUCTOR DEVICE HAVING A TRENCH WITH A STEP-FREE INSULATION FILM

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 294 days.

(21) Appl. No.: 10/984,925

(22) Filed: Nov. 10, 2004

(65) Prior Publication Data

US 2005/0085036 A1    Apr. 21, 2005

Related U.S. Application Data

(62) Division of application No. 10/435,658, filed on May 12, 2003, now Pat. No. 6,833,304.

(30) Foreign Application Priority Data

May 13, 2002  (JP) .............................. 2002-137517

(51) Int. Cl.
*H01L 29/76* (2006.01)
*H01L 29/94* (2006.01)
*H01L 31/062* (2006.01)

(52) U.S. Cl. ................. 257/330; 257/333; 257/E27.091
(58) Field of Classification Search ................. 257/330, 257/332–333, E27.091, E27.095, E29.201
See application file for complete search history.

(56) References Cited

U.S. PATENT DOCUMENTS 5,387,528 A    2/1995  Hutchings et al.
6,372,595 B1   4/2002  Thiel et al.
6,613,684 B2   9/2003  Fujimoto
2003/0003654 A1  1/2003  Brown
2003/0085422 A1* 5/2003  Amali et al. ................. 257/329
2003/0214011 A1* 11/2003  Jianjun et al. .............. 257/500

FOREIGN PATENT DOCUMENTS

JP         6-209013         7/1994

* cited by examiner

*Primary Examiner*—Thanhha S. Pham
(74) *Attorney, Agent, or Firm*—Rabin & Berdo, PC

(57) ABSTRACT

A method of manufacturing a semiconductor device provided with a MOS field effect transistor having a channel region of a first conduction type formed in a surface layer portion of a semiconductor substrate, a source region of a second conduction type formed on a rim portion of a trench made to penetrate through the channel region, and a base region of the first conduction type formed in the surface layer portion of the semiconductor substrate adjacently to the source region. The method includes: a step of forming a mask layer having a base-region forming opening corresponding to the base region and a trench forming opening corresponding to the trench on the semiconductor substrate in which the channel region is formed; a base-region forming step of introducing impurities through the base-region forming opening; a trench forming step of forming the trench through the trench forming opening; and a step of forming a gate insulation film on an inner wall surface of the trench.

5 Claims, 6 Drawing Sheets

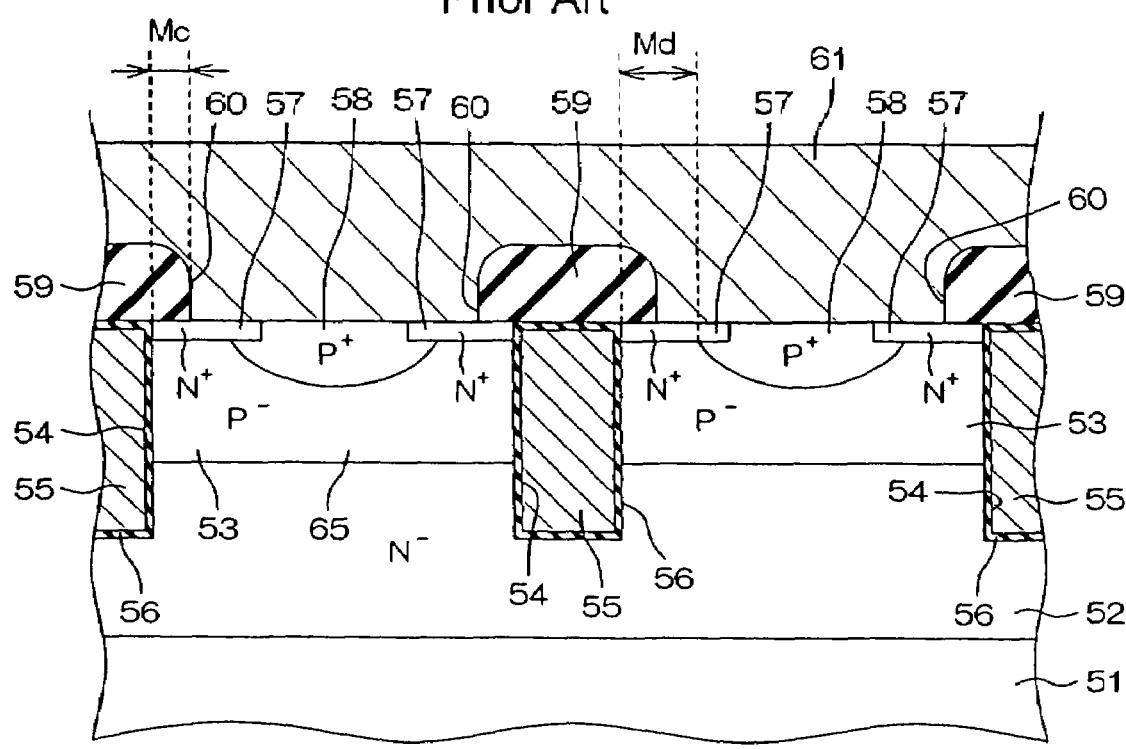

SEMICONDUCTOR DEVICE HAVING A TRENCH WITH A STEP-FREE INSULATION FILM

This is a Divisional of U.S. application Ser. No.: 10/435,658, filed May 12, 2003 now U.S. Pat. No. 6,833,304, the subject matter of which is incorporated herein by reference.

BACKGROUND OF THE INVENTION

1. Field of the Invention

The present invention relates to a manufacturing method of a semiconductor device in which is formed a MOS FET (Metal-Oxide-Semiconductor Field Effect Transistor) having a trench structure, and a semiconductor device suitably manufactured through the manufacturing method.

2. Description of Related Art

A semiconductor device includes a type provided with a MOS FET (MOS Field Effect Transistor) having a trench structure. In a semiconductor device of this type, a source region and a channel region are placed along the depth direction of the trench, which makes it possible to achieve miniaturization of elements and a reduction of power consumption.

FIG. 3 is a schematic cross section showing a structure of a semiconductor device provided with a MOS FET having the trench structure, obtained through a conventional manufacturing method.

An $N^-$ epitaxial layer 52 is formed on the surface of a silicon substrate 51, and a diffusion region 65 is formed on the $N^-$ epitaxial layer 52. Trenches 54, each of which penetrates through the diffusion region 65 and halfway through the $N^-$ epitaxial layer 52 in the thickness direction, are formed at regular intervals. Inside each trench 54 is provided a gate electrode 55 made of polysilicon, and a gate oxide film 56 is provided to surround the gate electrode 55.

$N^+$ source regions 57 and $P^+$ base regions 58 are formed in the surface layer portion of the diffusion region 65, and the rest of the diffusion region 65 forms a $P^-$ channel region 53. The $N^+$ source regions 57 are formed on the periphery (rim portion) of each trench 54. The $P^+$ base region 58 is formed between every two adjacent $N^+$ source regions 57, and is connected to the $P^-$ channel region 53.

Insulation films 59 made of silicon oxide are formed to cover above each trench 54. The insulation films 59 are also present on the periphery of each trench 54 (on the $N^+$ source regions 57) when viewed in a plane. A space between every two adjacent insulation films 59 forms a contact hole 60. An electrode film 61 made of metal, such as aluminum, is formed on the diffusion region 65 and the insulation films 59. The electrode film 61 is placed to fill in the contact holes 60.

While the semiconductor device described above is operating, a current flows from the $N^+$ source regions 57 toward the silicon substrate 51 through the $P^-$ channel region 53 along the gate oxide films 56.

FIG. 4(a), FIG. 4(b), and FIG. 4(c) are schematic cross sections used to explain a manufacturing method of the semiconductor device of FIG. 3.

Initially, the $N^-$ epitaxial layer 52 is formed on the silicon substrate 51. Then, impurities used to control a conduction type to be a p-type are introduced into the surface layer portion of the $N^-$ epitaxial layer 52, whereby the $P^-$ channel region 53 is formed. Subsequently, the $P^+$ base regions 58 and the trenches 54 are formed. Although it does not matter which of the $P^+$ base regions 58 and the trenches 54 are formed first, the following description will describe a case where the $P^+$ regions 58 are formed first.

A mask layer 71 having openings (hereinafter, referred to as base-region forming openings) 70 in portions corresponding to the $P^+$ base regions 58 is formed on the $P^-$ channel region 53. Then, impurities are implanted and diffused into the $P^-$ channel region 53 through the base-region forming openings 70, whereby the $P^+$ base regions 58 are formed (FIG. 4(a)). The mask layer 71 is then removed. Subsequently, the $N^+$ source regions 57 are formed through the same method using another mask layer having openings.

Then, a first resist film 73 having openings (hereinafter, referred to as trench forming openings) 72 in portions corresponding to the trenches 54 is formed on the $P^-$ channel region 53. Then, the $N^+$ source regions 57, the $P^-$ channel region 53, and the upper portion of the $N^-$ epitaxial layer 52 are etched away through the trench forming openings 72, whereby the trenches 54 are formed (FIG. 4(b)). The first resist film 73 is then removed, and the inner wall surface of each trench 54 is subjected to thermal oxidation, whereby the gate oxide film 56 is formed.

Then, a polysilicon film is formed to fill in the trenches 54. Impurities are introduced into the polysilicon film to make the polysilicon film electrically conductive, whereby the gate electrodes 55 are formed. The top surfaces of the respective gate electrodes 55 are flush with the surfaces of the $P^+$ base regions 58 and the $N^+$ source regions 57.

Subsequently, a silicon oxide film 76 is formed across the entire surface of the silicon substrate 51 having undergone the foregoing processes. A second resist film 75 having openings 74 in portions corresponding to the contact holes 60 is then formed on the silicon oxide film 76 (FIG. 4(c)). The silicon oxide film 76 is etched away through the openings 74 of the second resist film 75, whereby the contact holes 60 are formed. Residual portions of the silicon oxide film 76 form the insulation films 59. After the second resist film 75 is removed, the electrode film 61 is formed on the silicon substrate 51 having undergone the foregoing processes. The semiconductor device shown in FIG. 3 is thus obtained.

The base-region forming openings 70 and the trench forming openings 72 are formed through the lithographic technique using a stepper (exposure apparatus). For this reason, the trench forming openings 72 are aligned and formed so that the trenches 54 will be formed at predetermined positions with respect to the $P^+$ base regions 58.

Also, the openings 74 used to form the contact holes 60 a realigned and formed so as to avoid portions above the trenches 54 (gate electrodes 55).

Referring to FIG. 3, because the $P^+$ base regions 58 need to be spaced apart from the gate oxide films 56, the base-region forming openings 70 are aligned with accuracy within a diffusion margin Md, which is equal to intervals between the $P^+$ base regions 58 at the predetermined positions and the gate oxide films 56. Also, because the insulation films 59 need to be present between the respective gate electrodes 55 and the electrode film 61, the contact holes 60 are aligned with accuracy within a contact margin Mc, which is equal to intervals between the contact holes 60 at adequate positions and the gate electrodes 55.

Incidentally, in order to meet the demand to reduce power consumption of the power MOS FET, miniaturization of cell pitches has been advancing recently, and the diffusion margin Md and the contact margin Mc are also becoming smaller. On the other hand, according to the manufacturing method as described above, for example, a shift in alignment of approximately 0.3 μm is inevitably caused during exposure by the exposure apparatus. For these reasons, it has been becoming difficult to form a microscopic MOS FET having a trench structure through the method described above.

SUMMARY OF THE INVENTION

It is therefore an object of the invention to provide a manufacturing method of a semiconductor device, capable of manufacturing a semiconductor device provided with a microscopic MOS FET having a trench structure.

Another object of the invention is to provide a semiconductor device provided with a MOS FET having a trench structure that can be miniaturized.

A manufacturing method of a semiconductor device of the invention is a method of manufacturing a semiconductor device provided with a MOS field effect transistor having a channel region of a first conduction type formed in a surface layer portion of a semiconductor substrate, a source region of a second conduction type formed on a rim portion of a trench made to penetrate through the channel region, and a base region of the first conduction type formed in the surface layer portion of the semiconductor substrate adjacently to the source region. The method includes: a step of introducing impurities used to control a conduction type to be the first conduction type into the surface layer portion of the semiconductor substrate in order to form the channel region; a step of forming a mask layer having a base-region forming opening corresponding to the base region and a trench forming opening corresponding to the trench on the semiconductor substrate in which the channel region is formed; a step of introducing the impurities used to control a conduction type to be the first conduction type into a surface layer portion of the channel region through the base-region forming opening in the mask layer in order to form the base region; a step of forming the trench that penetrates through the channel region by etching away the surface layer portion of the semiconductor substrate through the trench forming opening in the mask layer; and a step of forming a gate insulation film on an inner wall surface of the trench.

According to the invention, the positions of the base region and the trench in the surface layer portion of the semiconductor substrate are determined by the base-region forming opening and the trench forming opening made in the mask layer. Hence, for example, in a case where the base region is formed first and then the trench is formed, the trench is formed while being aligned exactly with respect to the base region. Likewise, in a case where the trench is formed first, and then the base region is formed, the base region is formed while being aligned exactly with respect to the trench. The trench forming opening and the trench together form a single concave having a continuous inner sidewall surface.

When the base region is formed, for example, the impurities may be introduced through the base-region forming opening by temporarily filling the trench forming opening with resist or the like. Likewise, when the trench is formed, for example, the surface layer portion of the semiconductor substrate may be etched away by temporarily filling the base-region forming opening with resistor the like. The resist is removed after the base region or the trench is formed.

As has been described above, according to the manufacturing method of the semiconductor device, the base region and the trench are aligned automatically (self-aligned), and a process for performing exact alignment is no longer needed. It is thus possible to manufacture a semiconductor device provided with a microscopic MOS FET having a trench structure.

It is preferable that the method further includes: a step of forming a polysilicon film in a region from inside the trench to a lower portion inside the trench forming opening and at a lower portion inside the base-region forming opening; a step of making the polysilicon film electrically conductive by introducing impurities into the polysilicon film; a polysilicon film oxidizing step of forming a silicon oxide film by oxidizing, of the polysilicon film, an upper portion of the polysilicon film inside the trench, the polysilicon film inside the trench forming opening, and the polysilicon film inside the base-region forming opening; a step of forming resist on the silicon oxide film inside the trench forming opening and inside the base-region forming opening after the polysilicon film oxidizing step; a step of forming a source-region forming opening corresponding to the source region between the base region and the trench by etching away the mask layer using the resist as a mask; and a step of introducing impurities used to control a conduction type to be the second conduction type into the surface layer portion of the channel region through the source-region forming opening in order to form the source region.

For example, the polysilicon film may be formed on the semiconductor substrate entirely, and removed through etching, so that the polysilicon film is only left and formed inside the trench, at the lower portion inside the trench forming opening, and at the lower portion inside the base-region forming opening.

In the step of oxidizing the polysilicon film, a silicon oxide film is formed in a portion from the upper portion of the trench to the lower portion of the trench forming opening. By forming an electrode film in the step later so as to cover above the silicon oxide film, the silicon oxide film then lies between the gate electrode and the electrode film. Hence, the silicon oxide film thus obtained can be used as an insulation film. The electrode film can be formed in such a manner so as to be connected to the source region through the use of a space between two adjacent insulation films as a contact hole.

Of the polysilicon film that is made electrically conductive through introduction of impurities, part of the polysilicon film inside the trench is not oxidized and left intact as polysilicon. The polysilicon thus left forms a gate electrode.

The gate electrode and the insulation film are both obtained from the polysilicon film that is formed inside the concave formed by the trench forming opening and the trench. Hence, the insulation film is formed directly above the gate electrode, and the side surface of the insulation film extends from the inside to the outside of the trench along the inner sidewall surface of the trench.

As has been described, the insulation film is formed while being aligned automatically with respect to the trench. Hence, the contact hole is formed while being aligned automatically with respect to the trench, etc.

Further, because the source-region forming opening is formed in such a manner that the opening portion (the base-region forming opening and the trench forming opening) and the non-opening portion of the mask layer are inverted, the position of the source region is also determined by the mask layer. Hence, the source region is formed while being aligned automatically with respect to the base region and the trench.

As has been described, according to the manufacturing method of the semiconductor device, the base region, the trench, the source region, and the insulation film (contact hole) are aligned automatically, and a step of performing exact alignment is no longer needed. It is thus possible to manufacture a semiconductor device provided with a microscopic MOS FET having a trench structure.

The mask layer may be a layer having resistance to an etching medium used in the trench forming step, and for example, it may be a layer made of silicon oxide. In this case, for example, the trench can be-formed through dry etching.

A semiconductor device of the invention includes: a channel region of a first conduction type formed in a surface layer portion of a semiconductor substrate; a source region of a second conduction type formed on a rim portion of a trench made to penetrate through the channel region; a base region of the first conduction type formed in the surface layer portion of the semiconductor substrate adjacently to the source region; a gate insulation film formed on an inner sidewall surface of the trench; a gate electrode placed inside the trench to oppose the channel region with the gate insulation film in between; and an insulation film provided from an inside to an outside of the trench above the gate electrode and having a side surface extending along an inner sidewall surface of the trench from the inside to the outside of the trench.

The above and other objects, features, and advantages of the invention will become more apparent from the following description of embodiments with reference to the accompanying drawings.

BRIEF DESCRIPTION OF THE DRAWINGS

FIG. 3 is a schematic cross section showing a structure of a semiconductor device provided with a MOS FET having a trench structure obtained through a conventional manufacturing method.

DESCRIPTION OF THE PREFERRED EMBODIMENTS

Figure 1:
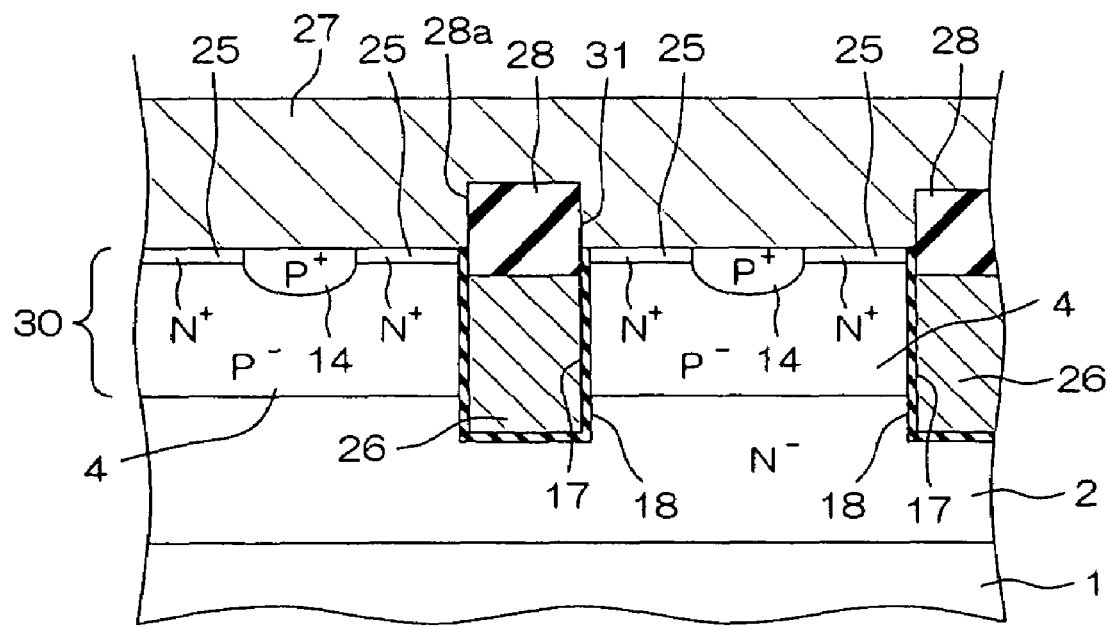
FIG. 1 is a schematic cross section showing a structure of a semiconductor device according to one embodiment of the invention.

FIG. 1 is a schematic cross section showing a structure of a semiconductor device provided with a MOS FET having a trench structure according to one embodiment of the invention.

An $N^-$ epitaxial layer 2 is formed on the surface of a silicon substrate 1, and a diffusion region 30 is formed on the $N^-$ epitaxial layer 2. Trenches 17, each of which penetrates through the diffusion region 30 and halfway through the $N^-$ epitaxial layer 2 in the thickness direction, are formed at regular intervals. The respective trenches 17 extend in parallel with one another in a direction perpendicular to the sheet plane of FIG. 1.

Inside each trench 17 is placed a gate electrode 26 made of polysilicon that has been made electrically conductive through the introduction of impurities. A gate oxide film 18 is provided to surround each gate electrode 26.

$N^+$ source regions 25 and $P^+$ base regions 14 are formed in the surface layer portion of the diffusion region 30, and the rest of the diffusion region 30 forms a $P^-$ channel region 4. The $N^+$ source regions 25 are formed on the periphery (rim portion) of each trench 17, and the $P^+$ base regions 14 are formed so that the $N^+$ source region 25 are adjacent thereto and on either side. The $P^+$ base regions 14 are connected to the $P^-$ channel region 4.

The $P^+$ base regions 14 have a greater thickness than the $N^+$ source regions 25. In other words, the $P^-$ channel region 4 is thinner in a portion adjacent to the $P^+$ base regions 14 than in a portion adjacent to the $N^+$ source regions 25. Also, the $P^+$ base regions 14 and the $N^+$ source regions 25 are formed to have a high concentration of impurities and thereby have low resistance in comparison with the $P^-$ channel region 4. According to the arrangement as described above, in a case where the MOS FET is used as a switch, a surge current generated when the switch is turned OFF flows through a portion including the $P^+$ base regions 14 having low resistance. This makes it possible to avoid an unwanted event that the semiconductor element heats and breaks. In short, the MOS FET has a large L load capacity.

An insulation film 28 made of silicon oxide is formed above each gate electrode 26. The insulation films 28 are formed in a region from the inside to the outside of the respective trenches 17. The side surface 28a of each insulation film 28 has no step or the like and extends from the inside to the outside of the trench 17 along the inner sidewall surface of the trench 17. A space between every two adjacent insulation films 28 forms a contact hole 31. A metal electrode film 27 is formed on the diffusion region 30 and the insulation films 28. The metal electrode film 27 is placed to fill in the contact holes 31, and thereby comes in contact with the diffusion region 30 exposed inside the contact holes 31.

While the semiconductor device described above is operating, a current flows between the $N^+$ source regions 25 and the silicon substrate 1 through the $P^-$ channel region 4 along the gate oxide films 18.

FIG. 2 (a) through FIG. 2 (i) are schematic cross sections used to explain a manufacturing method of the semiconductor device of FIG. 1.

Initially, the $N^-$ epitaxial layer 2 is formed on the silicon substrate 1. Then, the silicon substrate 1 on which the $N^-$ epitaxial layer 2 is formed is heated, whereby a thermal oxidation film 3 is formed in the surface layer portion of the $N^-$ epitaxial layer 2. A thickness of the thermal oxidation film 3 is, for example, 100 to 1000 Å approximately.

Figure 2A:
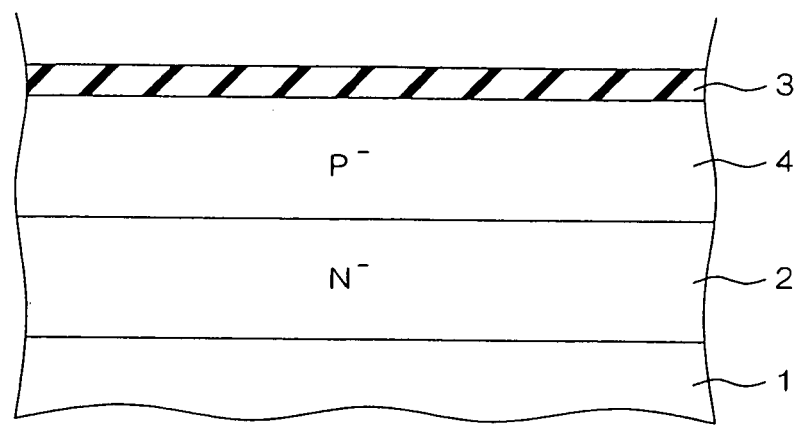
FIG. 2 (a) through FIG. 2 (i) are schematic cross sections used to explain a group of processes in a manufacturing method of the semiconductor device of FIG. 1.

Then, boron ions are implanted into the surface layer portion of the $N^-$ epitaxial layer 2 through the thermal oxidation film 3, whereby the $P^-$ channel region 4 is formed. This state is illustrated in FIG. 2(a). When the boron ions are implanted, energy for accelerating boron ions is, for example, 100 keV approximately, and a concentration of boron ions is, for example, $1\times10^{13}$ to $10\times10^{13}$ atoms/cm$^2$.

Then, a silicon oxide film 5 is formed on the thermal oxidation film 3, for example, through the CVD (Chemical Vapor Deposition) method. A thickness of the silicon oxide film 5 is, for example, 1000 to 10000 Å. The thermal oxidation film 3 and the silicon oxide film 5 together form a silicon oxide film 6. Further, a first resist film 7 is formed on the silicon oxide film 6, in which openings 8 and 9 are made at predetermined positions through lithography. The openings 8 and the openings 9 extend in a direction perpendicular to the sheet plane of FIG. 2(b).

The silicon oxide film 6 is then etched away through the openings 8 and 9 in the first resist film 7. Consequently, in the silicon oxide film 6, the base-region forming openings 10 are formed in portions corresponding to the openings 8 and the trench forming openings 11 are formed in portions corresponding to the openings 9. The base-region forming openings 10 and the trench forming openings 11 are placed alternately.

Figure 2B:
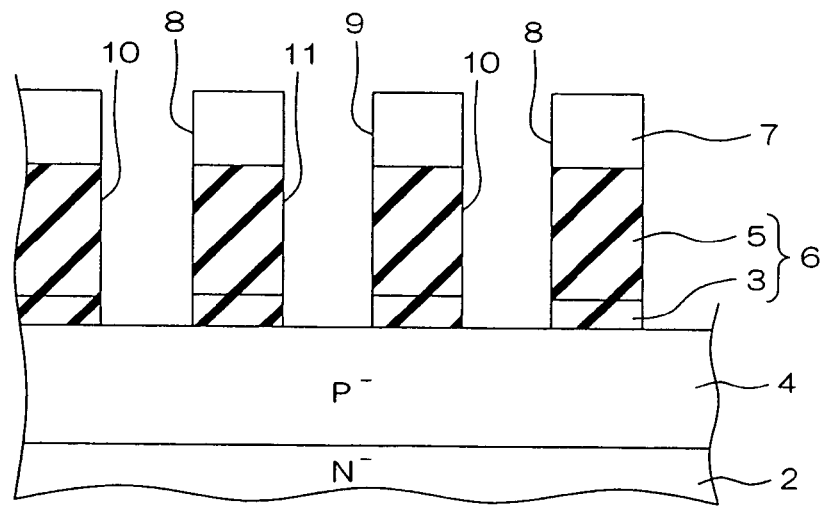

The P⁻ channel region 4 is exposed at the bottoms of the base-region forming openings 10 and the trench forming openings 11. This state is illustrated in FIG. 2(b). Widths of the base-region forming openings 10 and the trench forming openings 11 are, for example, 0.4 to 0.6 μm approximately. The first resist film 7 is then removed.

Then, a second resist film 13 is formed, in which openings 12 are made at predetermined positions through lithography. Consequently, the base-region forming openings 10 are positioned inside the openings 12 and the trench forming openings 11 are filled with the second resist film 13.

Subsequently, boron ions are implanted into the surface layer portion of the P⁻ channel region 4 through the base-region forming openings 10 inside the openings 12, whereby the P⁺ base regions 14 are formed (FIG. 2 (c)). In this instance, the silicon oxide film 6 functions as a mask that prevents boron ions from being implanted into regions of the P⁻ channel region 4 other than those corresponding to the base-region forming openings 10. A density of boron ions to be implanted is, for example, $1 \times 10^{15}$ to $10 \times 10^{15}$ atoms/cm². The second resist film 13 is then removed.

Then, a third resist film 16 is formed, in which openings 15 are made at predetermined positions through lithography. Consequently, the trench forming openings 11 are positioned inside the openings 15 and the base-region forming openings 10 are filled with the third resist film 16.

Subsequently, the trenches 17, each of which penetrates through the P⁻ channel region 4 and halfway through the N⁻ epitaxial layer 2 in the thickness direction (to the top portion of the N⁻ epitaxial layer 2), are formed by means of etching through the trench forming openings 11 inside the openings 15 (FIG. 2 (d)). A depth of the trenches 17 is determined by a thickness of the P⁻ channel region 4 or the like, and for example, it is determined to be 0.5 to 3.0 μm. Etching is performed, for example, through dry etching. In this case, the silicon oxide film 6 has resistance to an etching medium, and thereby functions as a hard mask that protects portions other than those corresponding to the trench forming openings 11 from the etching medium.

Each trench forming opening 11 and the corresponding trench 17 form a single concave having a continuous inner sidewall surface along substantially the same plane. The third resist film 16 is then removed.

Then, the silicon substrate 1 having undergone the foregoing processes is heated, whereby the gate oxide film 18 is formed in the vicinity of the inner surface of each trench 17 through thermal oxidation. In this instance, the vicinities of the surfaces of the P⁺ base regions 14 exposed in the base-region forming openings 10 are subjected to thermal oxidation concurrently.

Then, a polysilicon film 19 is formed on the silicon substrate 1 having undergone the foregoing processes, for example, through the CVD method. The polysilicon film 19 is formed so as to fill in the trenches 17, the trench forming openings 11, and the base-region forming openings 10. Subsequently, the polysilicon film 19 is etched away to leave the polysilicon film 19 at the lower portions inside the base-region forming openings 10, inside the trenches 17, and at the lower portions inside the trench forming openings 11. This state is illustrated in FIG. 2(e). Impurities are then implanted into the polysilicon film 19 and the polysilicon 19 is thereby made electrically conductive.

Figure 2C:
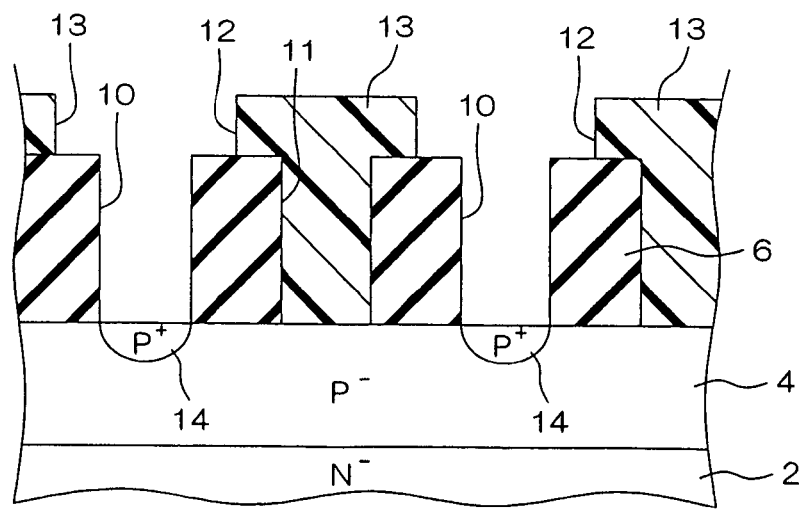
Figure 2D:
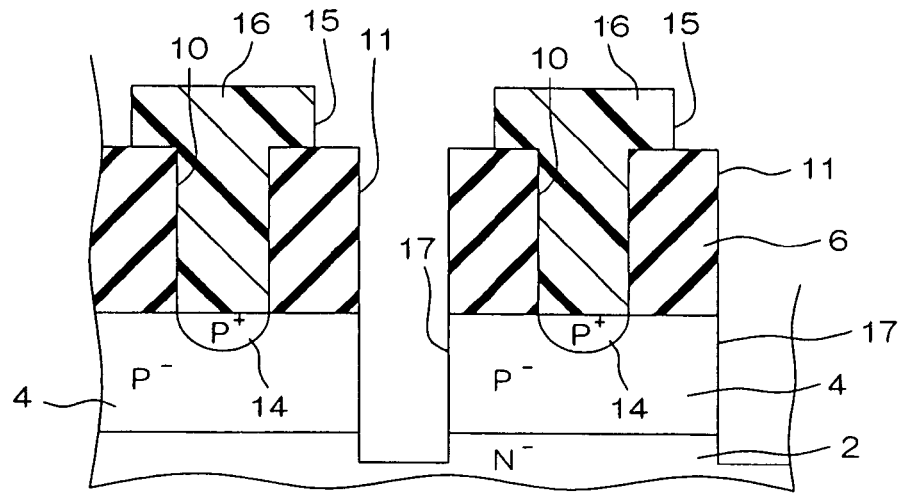
Figure 2E:
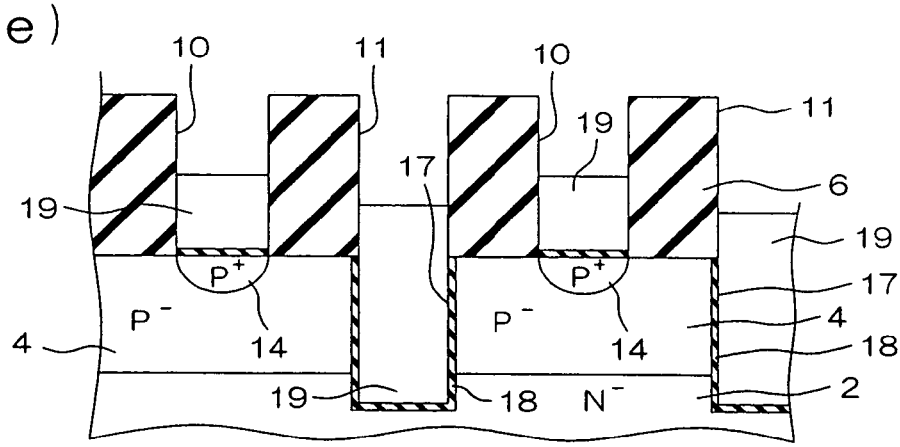
Figure 2F:
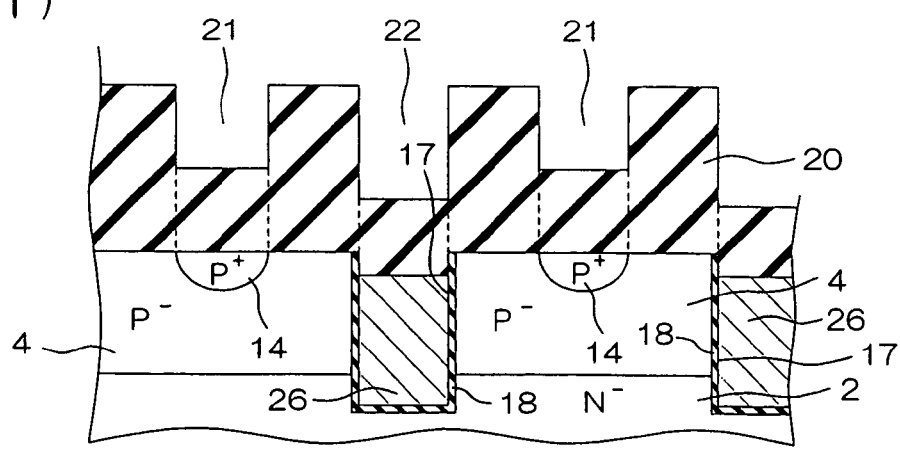

Then, the silicon substrate 1 having undergone the foregoing processes is subjected to oxidation, which gives rise to oxidation of the entire polysilicon film 19 inside the base-region forming openings 10 and inside the trench forming openings 11, and the upper portions of the polysilicon film 19 inside the trenches 17 (FIG. 2(f)).

Consequently, the thermal oxidation films in the vicinity of the surfaces of the P⁺ base regions 14, the oxidized polysilicon film 19, and the silicon oxide film 6 together form a silicon oxide film 20. The silicon oxide film 20 is provided with concaves 21 and 22 in portions corresponding to the base-region forming openings 10 and the trench forming openings 11, respectively. The polysilicon film 19 let inside each trench 17 without being oxidized forms the gate electrode 26.

Then, a fourth resist film 23 is formed to fully cover the surface of the silicon oxide film 20. Subsequently, the fourth resist film 23 is etched back, so that the fourth resist film 23 is present inside the concaves 21 and 22 alone (FIG. 2(g)).

Then, the silicon oxide film 20 is etched away using the fourth resist mask 23 inside the concaves 21 and 22 as a mask. Etching is performed, for example, through dry etching (for instance, reactive ion etching (RIE)). Consequently, source-region forming openings 24 are formed in the silicon oxide film 20. In other words, the source-region forming openings 24 are formed while being aligned exactly between the base regions 14 and the trenches 17 in such a manner that the opening portions (the base-region forming openings 10 and the trench forming openings 11) and the non-opening portions of the silicon oxide film 6 (see FIG. 2(b)) are inverted.

In this state, the P⁻ channel region 4 between the trenches 17 and the P⁺ base regions 14 is exposed inside the respective source-region forming openings 24. Also, the silicon oxide film 20 is present above each gate electrode 26 and above each P⁺ base region 14.

Subsequently, impurities used to control the conduction type to be an n-type are implanted into the surface layer portion of the P⁻ channel region 4 through the source-region forming openings 24, and the silicon substrate 1 having undergone the foregoing processes is annealed, whereby the N⁺ source regions 25 are formed. The fourth resist film 23 is then removed. This state is illustrated in FIG. 2(h).

Then, a fifth resist film 29 is formed, in which openings 32 are made at predetermined positions through lithography. Consequently, the silicon oxide film 20 above each gate electrode 26 is covered with the fifth resist film 29, and the silicon oxide film 20 above each P⁺ base region 14 is exposed inside the corresponding opening 32 (FIG. 2(i)).

The exposed silicon oxide film 20 above each P⁺ base region 14 is then removed, for example, through wet etching. The fifth resist film 29 is then removed. Further, a metal electrode film 27 is formed on the silicon substrate 1 having undergone the foregoing processes. The silicon oxide film 20 above each gate electrode 26 forms the insulation film 28 that lies between the gate electrode 26 and the metal electrode film 27. In this manner, the semiconductor device shown in FIG. 1 is obtained.

As described above, the insulation films 28 are obtained by oxidizing part of the polysilicon film 20 formed inside the trenches 17 and the trench forming openings 11. For this reason, the side surface 28a of each insulation film 28 extends in a direction along which the inner sidewall surface of the trench 17 extends (a direction perpendicular or nearly perpendicular to the silicon substrate 1), and therefore has no step or the like.

In the manufacturing method as described above, the positions of the P⁺ base regions 14 and the trenches 17 are determined respectively by the base-region forming openings 10 and the trench forming openings 11 made in the silicon oxide film 6 (see FIG. 2 (c) and FIG. 2 (d)). The positions of the base-region forming openings 10 and the trench forming openings 11 are determined respectively by the openings 8 and 9 in the first resist film 7 (see FIG. 2(b)).

Figure 2G:
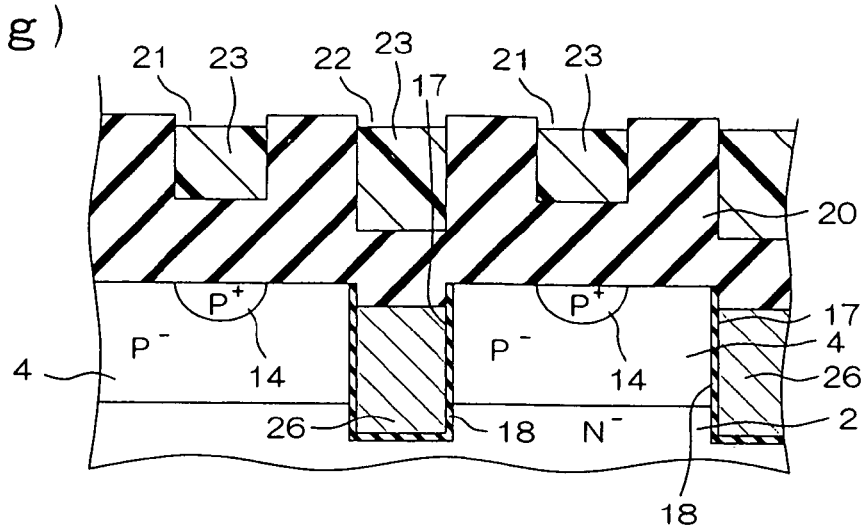
Figure 2H:
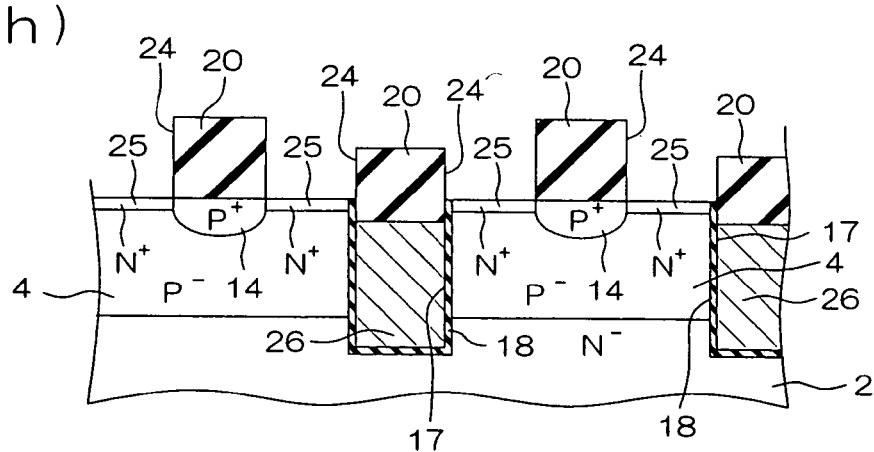

Also, as can be understood from comparison between FIG. 2(g) and FIG. 2(h), the N+ source regions 25 are formed in portions corresponding to the silicon oxide film 6 (silicon oxide film 20) present between the bases-region forming openings 10 (concaves 21) and the trench forming openings 11 (concaves 22). Hence, the positions of the N+ source regions 25 are also determined by the positions at which the base-region forming openings 10 and the trench forming openings 11 are formed in the silicon oxide film 6.

Further, the positions of the insulation films 28 (the positions of the contact holes 31) are determined by the trench forming openings 11 in the silicon oxide film 6.

Hence, the relative positional relations among the P+ base regions 14, the trenches 17, the N+ source regions 25, and the insulation films 28 (contact holes 31) are all determined by a single silicon oxide film 6. This eliminates the need of separate alignment when each is formed. In other words, the P+ base regions 14, the trenches 17, the N+ source regions 25, and the insulation films 28 (contact holes 31) can be aligned automatically (self-aligned).

The openings 12 in the second resist film 13 need to be formed while being aligned with respect to the base-region forming openings 10 and the trench forming openings 11 (FIG. 2 (c)). However, the openings 12 only have to be formed in such a manner that the end portion of each opening 12 is positioned on the silicon oxide film 6 present between the base-region forming opening 10 and the trench forming opening 11. Thus, an alignment margin of the openings 12 is large in comparison with the diffusion margin Md and the contact margin Mc (see FIG. 3) in the conventional manufacturing method. As has been described, highly precise alignment is not needed when the openings 12 are formed.

Figure 2I:
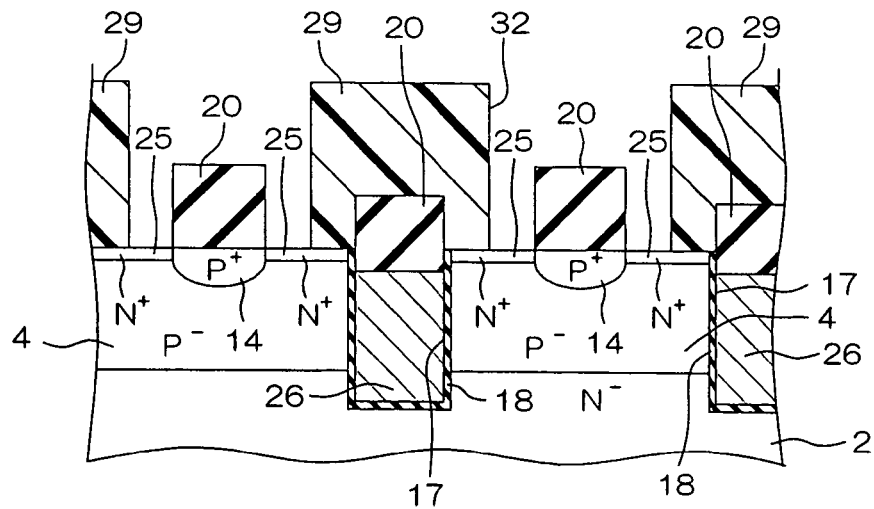
Figure 4A:
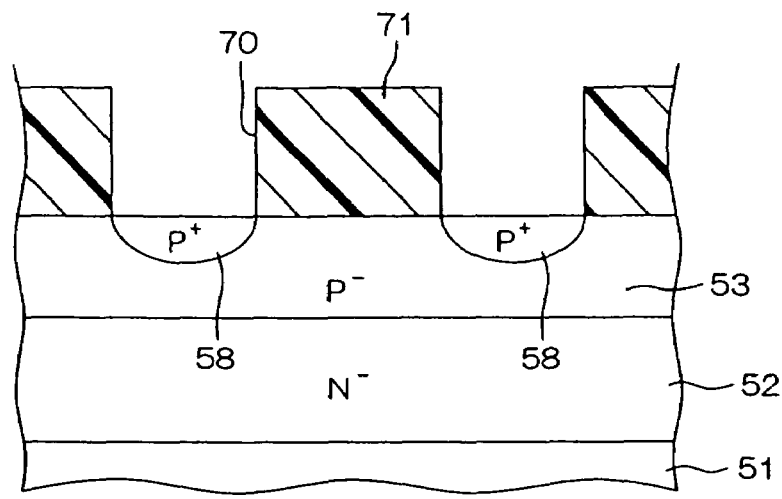
FIG. 4(a), FIG. 4(b), and FIG. 4(c) are schematic cross sections used to explain a manufacturing method of the semiconductor device of FIG. 3.
Figure 4B:
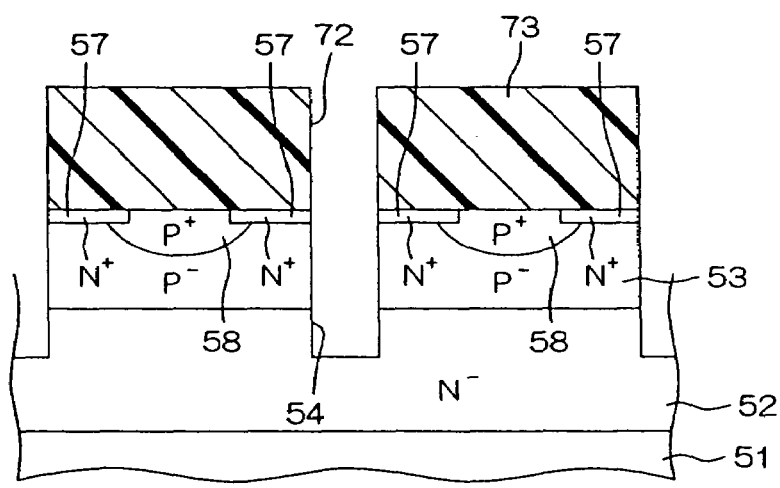
Figure 4C:
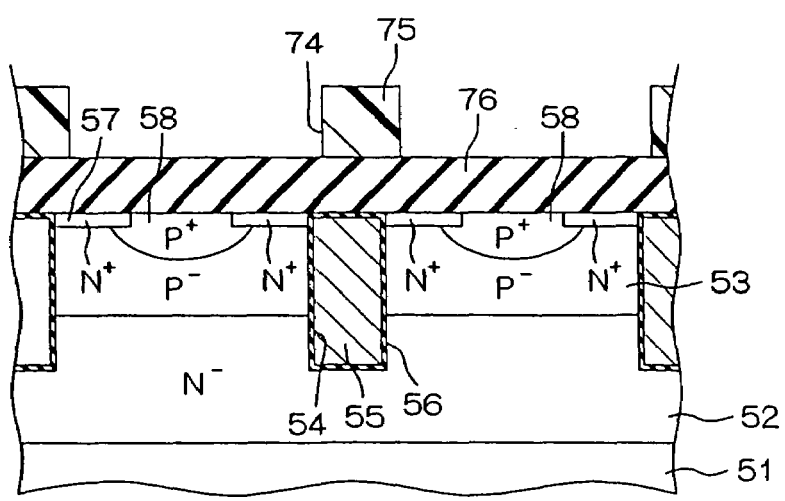

Likewise, large alignment margins are allowed for the openings 15 in the third resist film 16 (FIG. 2 (d)) and for the openings 32 in the fifth resist film 29 (FIG. 2(i)).

Also, the fourth resist film 23 can be formed to be present inside the concaves 21 and 22 alone by only controlling its etching thickness, which makes the alignment in the horizontal direction unnecessary.

As has been described, according to the manufacturing method of the semiconductor device, because a process of performing exact alignment is no longer needed, it is possible to manufacture a semiconductor device provided with a microscopic MOS FET having a trench structure. Consequently, for example, even in a case where the elements are formed according the 0.4 μm rule using the conventional stepper (exposure apparatus), a cell density (the number of cells per unit area) can be improved markedly, that is, three to five times larger than the density conventionally achieved.

For example, when it is designed that the width of the trenches 17 and the width of the P+ base regions 14 are both 0.4 μm, according to the manufacturing method of the semiconductor device of the invention, the cell pitch width can be set to as narrow as 1.5 to 2.0 μm, for example. When the cells are miniaturized, the number and the width of the P− channel region 4 per unit area can be increased, which in turn makes it possible to enlarge the channel area. Consequently, the channel resistance can be reduced, and hence, the ON resistance of the semiconductor device can be reduced.

While the above description described the embodiment of the invention, the invention can be implemented in another embodiment. For example, the embodiment above described a case of a semiconductor device provided with an n-type channel MOS FET. However, the semiconductor device may be provided with a p-type channel MOS FET.

Also, in the embodiment above, the P+ base regions 14 are formed first (FIG. 2(c)) and then the trenches 17 are formed (FIG. 2 (d)). However, the trenches 17 may be formed first followed by the P+ base regions 14.

While the above description described embodiments of the invention in detail, it should be appreciated that these embodiments represent examples to provide clear understanding of the technical contents of the invention, and the invention is not limited to these examples. The spirit and the scope of the invention, therefore, are limited solely by the scope of the appended claims.

This application is based on Application No. 2002-137517 filed with the Japanese Patent Office on May 13, 2002, the entire content of which is incorporated hereinto by reference.

What is claimed is:

1. A semiconductor device, comprising:
    a channel region of a first conduction type formed in a surface layer portion of a semiconductor substrate, the channel region having a trench penetrating therethrough;
    a source region of a second conduction type formed adjacent to a rim portion of the trench;
    a base region of the first conduction type formed in the surface layer portion of the semiconductor substrate adjacent to the source region;
    a gate insulation film formed on an inner sidewall surface of the trench;
    a gate electrode placed inside the trench to oppose the channel region with the gate insulation film in between; and
    an insulation film disposed above the gate electrode, and having a portion inside of the trench, and a further portion outside of the trench which protrudes above the rim portion and from an end of the gate insulation film opposite to a bottom of the trench, the portion of the insulation film inside of the trench having a side surface extending along a sidewall surface of the gate insulation film the portion of the insulation film outside of the trench also having a side surface that is contiguous with, and in a same plane as, the side surface of the portion inside of the trench, so that a transition between the portion of the insulation film outside of the trench inside of the trench and the further portion outside of the trench is step-free.

2. A semiconductor device according to claim 1, wherein the side surface of the insulation film defines a contact hole, the contact hole being filled with a metal electrode in contact with the source region and the base region.

3. A semiconductor device according to claim 1, wherein the channel region is thinner in a portion adjacent to the base region than in a portion adjacent to the source region.

4. A semiconductor device according to claim 1, wherein the base region has a high concentration of impurities in comparison with the channel region.

5. A semiconductor device according to claim 1, wherein the insulation film is made of silicon oxide.

* * * * *